(12) United States Patent
Tanikawa

(10) Patent No.: US 8,442,087 B2
(45) Date of Patent: May 14, 2013

(54) MOUNTING MEMBER AND SEMICONDUCTOR LASER APPARATUS HAVING THE SAME

(75) Inventor: Takumi Tanikawa, Otsu (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 42 days.

(21) Appl. No.: 12/874,432

(22) Filed: Sep. 2, 2010

(65) Prior Publication Data

US 2011/0064111 A1    Mar. 17, 2011

(30) Foreign Application Priority Data

Sep. 15, 2009   (JP) ................. 2009-213322

(51) Int. Cl.
*H01S 5/00* (2006.01)

(52) U.S. Cl.
USPC .................... 372/50.21; 372/50.121

(58) Field of Classification Search ............... 372/50.21
See application file for complete search history.

(56) References Cited

U.S. PATENT DOCUMENTS

| | | | |
|---|---|---|---|
| 2004/0028097 A1* | 2/2004 | Miyabe et al. | 372/36 |
| 2006/0251138 A1* | 11/2006 | Hata et al. | 372/50.121 |
| 2007/0025406 A1* | 2/2007 | Yamada et al. | 372/50.121 |
| 2007/0030872 A1* | 2/2007 | Sato et al. | 372/50.1 |

FOREIGN PATENT DOCUMENTS

| | | |
|---|---|---|
| JP | 2004-055744 A | 2/2004 |
| JP | 2009-027149 A | 2/2009 |

* cited by examiner

*Primary Examiner* — Xinning Niu
(74) *Attorney, Agent, or Firm* — Marvin A. Motsenbocker; Mots Law, PLLC

(57) ABSTRACT

Provided is a mounting member having a light receiving element, capable of constraining increase in size and of arranging a plurality of laser element portions closer to each other. The mounting member includes three or more electrodes, which respectively include element mounting portions arranged in a first direction, and a light receiving element disposed in a second direction intersecting with the first direction relative to the element mounting portions. The length in the second direction of at least one of the element mounting portions disposed at both ends in the first direction among the three or more element mounting portions is smaller than the length in the second direction of an element mounting portion disposed at an inner position in the first direction among the three or more element mounting portions.

14 Claims, 4 Drawing Sheets

MOUNTING MEMBER AND SEMICONDUCTOR LASER APPARATUS HAVING THE SAME

This application is based on Japanese Patent Application No. 2009-213322 filed on Sep. 15, 2009, the contents of which are hereby incorporated by reference.

BACKGROUND OF THE INVENTION

1. Field of the Invention

The present invention relates generally to a mounting member and a semiconductor laser apparatus having the same, and, more particularly, to a mounting member provided with a plurality of electrodes and a semiconductor laser apparatus having the same.

2. Description of Related Art

A mounting member provided with a plurality of electrodes has hitherto been known (see, e.g., Japanese Laid-Open Patent Publication No. 2004-55744).

Japanese Laid-Open Patent Publication No. 2004-55744 discloses a semiconductor laser apparatus having three semiconductor laser elements arranged in a predetermined direction and a block (mounting member) provided with three electrodes respectively mounted with the three semiconductor laser elements.

The block is provided with a photodiode (light receiving element) for monitoring an optical output of the semiconductor laser element at a position confronting a rear emission surface (back end surface) of the semiconductor laser element. Therefore, as compared to the case of separately providing a photodiode for monitoring the optical output of the semiconductor laser element, this semiconductor laser apparatus enables a simplified structure and constraint of increase in size.

Each of the electrodes of the block includes an element mounting portion mounted with the semiconductor laser element and a portion (wiring portion) connected to the element mounting portion and bonded with a conductive wire.

The portion bonded with the conductive wire of the center electrode of the three electrodes is formed between the element mounting portion of the center electrode and the element mounting portion of the adjacent electrode on one side. This makes it difficult to arrange the element mounting portion of the center electrode closer to the element mounting portion of the adjacent electrode on one side and hence to arrange the center semiconductor laser element of the three semiconductor laser elements closer to the semiconductor laser element on one side. As a result, it becomes inconveniently difficult to share among the three semiconductor laser elements an optical member such as a lens for receiving light emitted from them.

To improve this inconvenience, a semiconductor laser apparatus has been proposed that includes a portion bonded with a conductive wire of the center electrode projecting in a direction orthogonal to the direction in which the semiconductor laser elements are arranged (see, e.g., Japanese Laid-Open Patent Publication No. 2009-27149).

Japanese Laid-Open Patent Publication No. 2009-27149 discloses a semiconductor laser apparatus having three semiconductor laser elements (laser element portions) arranged in a predetermined direction and a base mounted with the three semiconductor laser elements.

The base is provided with three electrode layers respectively mounted with the three semiconductor laser elements. Each of the electrode layers includes an element mounting portion mounted with the semiconductor laser element and an area (wiring portion) connected to the element mounting portion and bonded with an Au wire. The area bonded with the Au wire of the center electrode layer of the three electrode layers is formed to project from the element mounting portion in the direction opposite to the light emitting surface of the semiconductor laser element.

This semiconductor laser apparatus therefore enables the element mounting portion of the center electrode layer and the element mounting portions of the adjacent electrode layers to be arranged closer and hence enables the three semiconductor laser elements to be arranged closer. This makes it possible to share among the three semiconductor laser elements an optical member such as a lens for receiving light emitted from them.

Japanese Laid-Open Patent Publication No. 2009-27149 is however different from Japanese Laid-Open Patent Publication No. 2004-55744 in that the base is not provided with a light receiving element for monitoring an optical output from the semiconductor laser element (laser element portion). Thus, since Japanese Laid-Open Patent Publication No. 2009-27149 necessitates separately providing the light receiving element to monitor the optical output from the semiconductor laser element, problematically, it is difficult to simplify the structure and the apparatus tends to be large.

It may be conceivable that the photodiode (light receiving element) of Japanese Laid-Open Patent Publication No. 2004-55744 is formed on the base (mounting member) of Japanese Laid-Open Patent Publication No. 2009-27149. Since, however, the area bonded with the Au wire of the center electrode layer must be formed to project from the element mounting portion in the direction opposite to the light emitting surface of the semiconductor laser element (toward the photodiode), the area bonded with the Au wire of the center electrode layer is disposed between the element mounting portion and the photodiode. This results in an increased distance between the element mounting portion and the photodiode, problematically making it difficult to constrain the base from increasing in size.

SUMMARY OF THE INVENTION

The present invention was conceived to address problems and inconveniences as discussed above and it is therefore the object of the present invention to provide a mounting member provided with a light receiving element and a semiconductor laser apparatus having the same, capable of constraining the increase in size and arranging a plurality of laser element portions closer to each other.

To achieve the object, according to a first aspect of the present invention, a mounting member mounted with a first semiconductor laser element and a second semiconductor laser element, the second semiconductor laser element being a monolithic multi-wavelength semiconductor laser element, includes: three or more electrodes respectively having element mounting portions arranged in a first direction; and a light receiving element disposed in a second direction, which intersects with the first direction, with respect to the element mounting portions. Here, the length in the second direction of at least one of the element mounting portions disposed at both ends in the first direction among the three or more element mounting portions is smaller than the length in the second direction of an element mounting portion disposed at an inner position in the first direction among the three or more element mounting portions. Moreover, the electrode having the element mounting portion disposed at the inner position includes a wiring portion which is connected to the element mounting portion disposed at the inner position and which extends outward in the first direction further than the at least one of the element mounting portions disposed at both ends.

As described above, the mounting member of the first aspect is provided with the light receiving element on a portion in the second direction from the element mounting portions. This simplifies the structure of the semiconductor laser apparatus and constrains the apparatus from increasing in size as compared to the case of providing the light receiving element separately from the mounting member.

In the mounting member of the first aspect, as described above, the length in the second direction of at least one of the element mounting portions disposed at both ends in the first direction among the three or more element mounting portions is made less than the length in the second direction of the element mounting portion disposed on the inside in the first direction among the three or more element mounting portions, and the electrode having the element mounting portion disposed on the inside is provided with the wiring portion extending outward in the first direction further than the at least one of the element mounting portions disposed at both ends. This eliminates the need for disposing the wiring portion between the element mounting portions, and enables the three or more element mounting portions to be arranged closer to each other. Therefore, the laser element portion of the first semiconductor laser element and the laser element portion of the second semiconductor laser element are arranged closer to each other. This enables an optical member such as a lens receiving light emitted from the first semiconductor laser element and the second semiconductor laser element to be shared by the first semiconductor laser element and the second semiconductor laser element. As a result, the number of parts such as optical members can be constrained from increasing and the apparatus can be constrained from increasing in size.

In the mounting member of the first aspect, as described above, the length in the second direction of at least one of the element mounting portions disposed at both ends is made less than the length in the second direction of the element mounting portion disposed on the inside. This ensures that the wiring portion is formed outward in the first direction further than the at least one of the element mounting portions disposed at both ends without projecting from the element mounting portion disposed on the inside in the second direction and without contacting with the element mounting portions disposed at both ends. Since the wiring portion is not required to project from the element mounting portion in the second direction in this manner, the distance can be constrained from increasing between the element mounting portions and the light receiving element. This constrains the mounting member from increasing in size.

In the mounting member of the first aspect, preferably, the wiring portion has an element mounting area on a portion thereof in the second direction with respect to the at least one of the element mounting portions disposed at both ends, and an insulating layer is disposed on the element mounting area. Since such an arrangement constrains the wiring portion from electrically connecting with a portion disposed on the element mounting area of the first semiconductor laser element or the second semiconductor laser element, the wiring portion can be disposed to pass under at least one of the laser element portions of the first semiconductor laser element and the second semiconductor laser element.

In the mounting member with the element mounting area disposed on the wiring portion, preferably, a first adhesive layer is disposed between the element mounting area and the insulating layer. Such an arrangement enables adhesive strength to be easily enhanced between the element mounting area of the wiring portion and the insulating layer.

In the mounting member of the first aspect, preferably, a conductive adhesive layer is disposed on the element mounting portion. By disposing the conductive adhesive layer on the element mounting portion of the mounting member in advance, the manufacturing process can be simplified when the first semiconductor laser element and the second semiconductor laser element are mounted on the mounting member.

In the mounting member with the conductive adhesive layer disposed on the element mounting portion, preferably, the wiring portion has an element mounting area on a portion thereof in the second direction with respect to the at least one of the element mounting portions disposed at both ends; an insulating layer is disposed on the element mounting area; a portion of the conductive adhesive layer is disposed on the insulating layer; and a second adhesive layer is disposed between the insulating layer and the conductive adhesive layer. Since the insulating layer is disposed on the element mounting area of the wiring portion to thereby constrain the wiring portion from electrically connecting with a portion disposed on the element mounting area of the first semiconductor laser element or the second semiconductor laser element, the wiring portion can be disposed to pass under at least one of the laser element portions of the first semiconductor laser element and the second semiconductor laser element.

By disposing the second adhesive layer between the insulating layer and the conductive adhesive layer, adhesive strength can easily be enhanced between the insulating layer and the conductive adhesive layer.

In the mounting member of the first aspect, preferably, laser element portions of the second semiconductor laser element are respectively mounted on the element mounting portion disposed at the inner position and on one of the element mounting portions disposed at both ends; the length in the second direction of one of the element mounting portions disposed at both ends is smaller than the length in the second direction of the element mounting portion disposed at the inner position; the wiring portion is formed to extend outward in the first direction further than the one of the element mounting portions disposed at both ends. Such an arrangement eliminates the need for reducing the length in the second direction of the element mounting portion mounted with the first semiconductor laser element, thus constraining the adhesive strength from deteriorating between the mounting member and the first semiconductor laser element. Even if the length in the second direction of one of the element mounting portions disposed at both ends is less than the lengths in the second direction of the element mounting portion disposed on the inside and the element mounting portion mounted with the first semiconductor laser element, the second semiconductor laser element adheres not only to one of the element mounting portions disposed on both ends but also to the element mounting portion disposed on the inside, thus ensuring the sufficient adhesive strength between the mounting member and the second semiconductor laser element.

In the mounting member of the first aspect, preferably, the length in the second direction of the electrode having the element mounting portion disposed at the inner position is substantially the same as the length in the second direction of the element mounting portion disposed at the inner position. Since the wiring portions does not project in the second direction from the element mounting portion disposed on the inside in such an arrangement, the distance can further be constrained from increasing between the element mounting portion and the light receiving element.

In the mounting member of the first aspect, preferably, the mounting member further includes a first conductivity type semiconductor substrate having the three or more electrodes formed on a surface thereof, and here the light receiving element is formed by disposing a second conductivity type area in a portion of the semiconductor substrate in the second direction with respect to the element mounting portion. Such an arrangement facilitates disposing the light receiving element on the mounting member.

In the mounting member of the first aspect, preferably, the first semiconductor laser element and the second semiconductor laser element are mounted junction-down. Since such an arrangement enables the laser element portion of the first semiconductor laser element and the laser element portion of the second semiconductor laser element to be arranged closer to the surface of the mounting member, the lights emitted from the first semiconductor laser element and the second semiconductor laser element can easily be made incident on the light receiving element even when the light receiving element is disposed closer to the element mounting portions.

According to a second aspect of the present invention, a semiconductor laser apparatus includes: a mounting member, a first semiconductor laser element mounted on the mounting member, and a second semiconductor laser element mounted on the mounting member, the second semiconductor laser element being a monolithic multi-wavelength semiconductor laser element. Here, the mounting member includes three or more electrodes respectively having element mounting portions arranged in a first direction, and a light receiving element disposed in a second direction, which intersects with the first direction, with respect to the element mounting portions. Moreover, the length in the second direction of at least one of the element mounting portions disposed at both ends in the first direction among the three or more element mounting portions is smaller than the length in the second direction of an element mounting portion disposed at an inner position in the first direction among the three or more element mounting portions. Moreover, the electrode having the element mounting portion disposed at the inner position includes a wiring portion which is connected to the element mounting portion disposed at the inner position and which extends outward in the first direction further than the at least one of the element mounting portions disposed at both ends. With such an arrangement, the semiconductor laser apparatus can be acquired that is capable of constraining increase in size and arranging a plurality of laser element portions closer to each other and that is provided with a light receiving element.

DETAILED DESCRIPTION OF PREFERRED EMBODIMENTS

Exemplary embodiments of the present invention will now be described with reference to the accompanying drawings.

A structure of a three-wavelength semiconductor laser apparatus 1 including a sub-mount 50 according to one embodiment of the present invention will be described with reference to FIGS. 1 to 6. The three-wavelength semiconductor laser apparatus 1 is an example of a "semiconductor laser apparatus" of the present invention.

Figure 1:
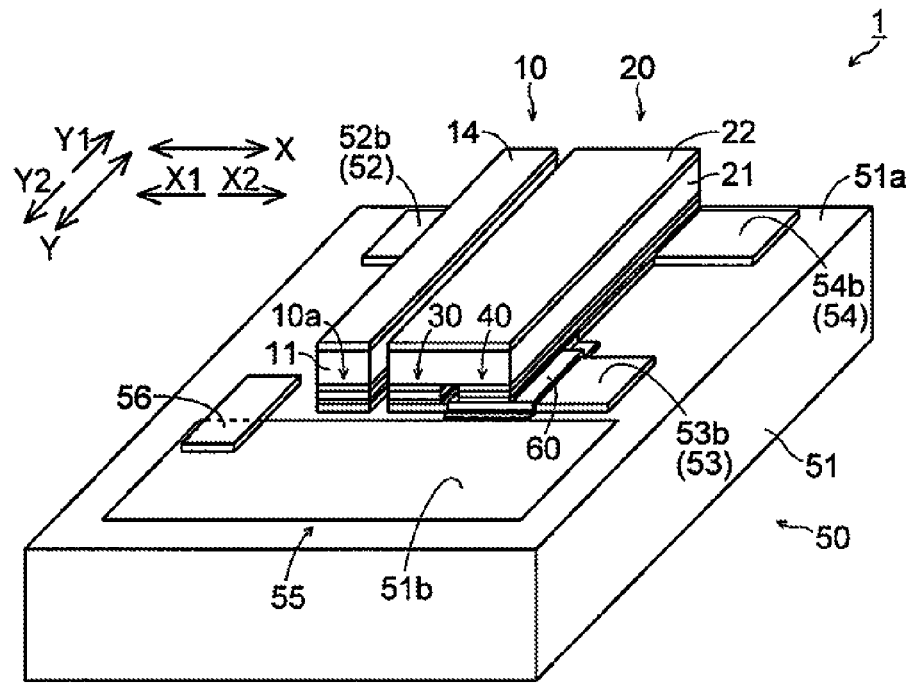
FIG. 1 is a perspective view of a structure of a three-wavelength semiconductor laser apparatus including a sub-mount according to one embodiment of the present invention.

As depicted in FIG. 1, the three-wavelength semiconductor laser apparatus 1 according to one embodiment of the present invention includes a blue-violet semiconductor laser element 10, a two-wavelength semiconductor laser element 20, and a sub-mount 50 mounted junction-down with the blue-violet semiconductor laser element 10 and the two-wavelength semiconductor laser element 20. The blue-violet semiconductor laser element 10 is an example of a "first semiconductor laser element" of the present invention and the two-wavelength semiconductor laser element 20 is an example of a "second semiconductor laser element" of the present invention. The sub-mount 50 is an example of a "mounting member" of the present invention.

Figure 2:
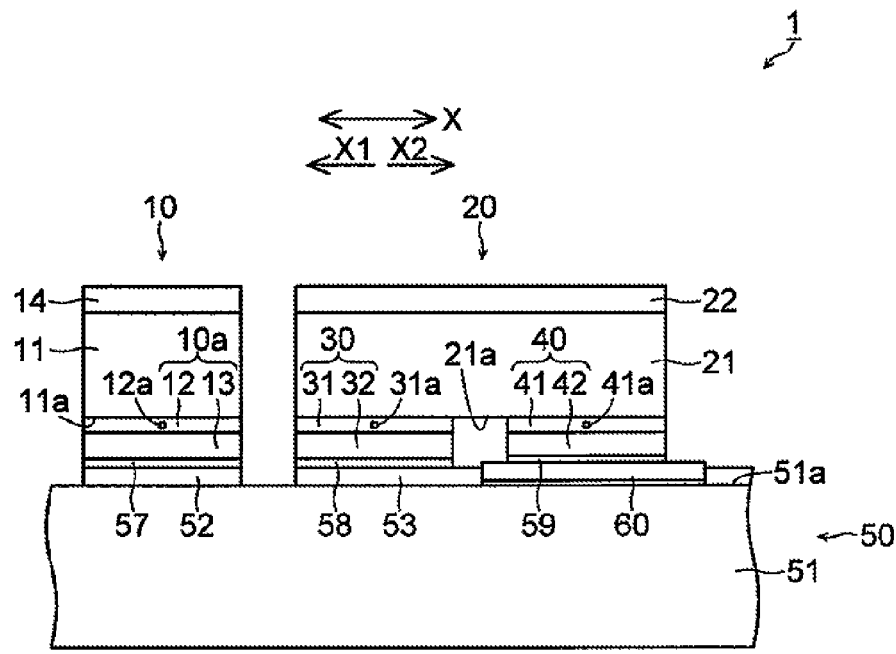
FIG. 2 is a diagram of a structure of the three-wavelength semiconductor laser apparatus including the sub-mount according to one embodiment of the present invention depicted in FIG. 1.

As depicted in FIG. 2, the blue-violet semiconductor laser element 10 and the two-wavelength semiconductor laser element 20 are adjacently arranged in the width direction (X-direction). The blue-violet semiconductor laser element 10 is disposed on one side (X1-direction side) in the X-direction of the two-wavelength semiconductor laser element 20. The X-direction is an example of a "first direction" of the present invention.

The blue-violet semiconductor laser element 10 has a function of emitting a laser beam in a wavelength band of about 405-nm (blue-violet laser beam), for example, and is used for recording/reproduction on BD (Blu-ray Disc (registered trademark)).

The blue-violet semiconductor laser element 10 includes a semiconductor substrate 11, a semiconductor layer 12 formed on a principal surface 11a of the semiconductor substrate 11, an electrode layer 13 having a thickness of a few μm formed on the semiconductor layer 12, and an electrode layer 14 formed on a rear surface of the semiconductor substrate 11. The semiconductor layer 12 and the electrode layer 13 make up a semiconductor laser element portion 10a.

An optical waveguide (not shown) is formed in the semiconductor layer 12 and extends in a direction (Y-direction (see FIG. 1)) orthogonal to the X-direction. A front end portion (an end portion in the Y1-direction (see FIG. 1)) of the optical waveguide acts as a light emitting portion (not shown) that emits a laser beam. A back end portion (an end portion in the Y2-direction (see FIG. 1)) of the optical waveguide acts as a light emitting portion 12a that emits a portion of the laser beam. The laser beam emitted from the light emitting portion 12a has an output power lower than the laser beam emitted from the light emitting portion at the front end (in the Y1-direction) and is used for monitoring the optical output of the blue-violet semiconductor laser element 10. The Y-direction is an example of a "second direction" of the present invention.

The electrode layer 13 is disposed on an electrode 52 described later of the sub-mount 50.

The electrode layer 14 is bonded with an Au wire not shown.

The two-wavelength semiconductor laser element 20 is a monolithic two-wavelength (multi-wavelength) semiconductor laser element and includes a semiconductor substrate 21, a red semiconductor laser element portion 30 and an infrared semiconductor laser element portion 40 provided in a predetermined area on a principal surface 21a of the semiconductor substrate 21, and a common electrode layer 22 formed on a rear surface of the semiconductor substrate 21. The red semiconductor laser element portion 30 and the infrared semiconductor laser element portion 40 are examples of a "laser element portion" of the present invention.

The red semiconductor laser element portion 30 has a function of emitting a laser beam in a wavelength band of about 660-nm (red laser beam), for example, and is used for recording/reproduction on DVD (Digital Versatile Disc). The infrared semiconductor laser element portion 40 has a function of emitting a laser beam in a wavelength band of about 785-nm (infrared laser beam), for example, and is used for recording/reproduction on CD (Compact Disc).

The red semiconductor laser element portion 30 is formed on a portion on one side (X1-direction side) in the X-direction of the principal surface 21a of the semiconductor substrate 21 and the infrared semiconductor laser element portion 40 is formed on a portion on the other side (X2-direction side) in the X-direction of the principal surface 21a of the semiconductor substrate 21. The red semiconductor laser element portion 30 and the infrared semiconductor laser element portion 40 are arranged with a predetermined space therebetween in the X-direction.

The red semiconductor laser element portion 30 includes a semiconductor layer 31 and an electrode layer 32 having a thickness of a few μm formed on the semiconductor layer 31.

An optical waveguide (not shown) is formed in the semiconductor layer 31 and extends in the Y-direction (see FIG. 1). A front end portion (an end portion in the Y1-direction (see FIG. 1)) of the optical waveguide acts as a light emitting portion (not shown) that emits a laser beam. A back end portion (an end portion in the Y2-direction (see FIG. 1)) of the optical waveguide acts as a light emitting portion 31a that emits a portion of the laser beam. The laser beam emitted from the light emitting portion 31a has an output power lower than the laser beam emitted from the light emitting portion at the front end (in the Y1-direction) and is used for monitoring the optical output of the red semiconductor laser element portion 30.

The electrode layer 32 is disposed on an electrode 53 described later of the sub-mount 50.

The infrared semiconductor laser element portion 40 includes a semiconductor layer 41 and an electrode layer 42 having a thickness of a few μm formed on the semiconductor layer 41.

An optical waveguide (not shown) is formed in the semiconductor layer 41 and extends in the Y-direction (see FIG. 1). A front end portion (an end portion in the Y1-direction (see FIG. 1)) of the optical waveguide acts as a light emitting portion (not shown) that emits a laser beam. A back end portion (an end portion in the Y2-direction (see FIG. 1)) of the optical waveguide acts as a light emitting portion 41a that emits a portion of the laser beam. The laser beam emitted from the light emitting portion 41a has an output power lower than the laser beam emitted from the light emitting portion at the front end (in the Y1-direction) and is used for monitoring the optical output of the infrared semiconductor laser element portion 40.

A distance between the light emitting portion 31a and the light emitting portion 12a of the blue-violet semiconductor laser element 10 is about 110 μm and a distance between the light emitting portion 31a and the light emitting portion 41a is also about 110 μm.

As depicted in FIG. 1, the electrode layer 42 (see FIG. 2) is disposed on electrodes 53 and 54 described later of the sub-mount 50.

The common electrode layer 22 is bonded with an Au wire not shown.

Figure 3:
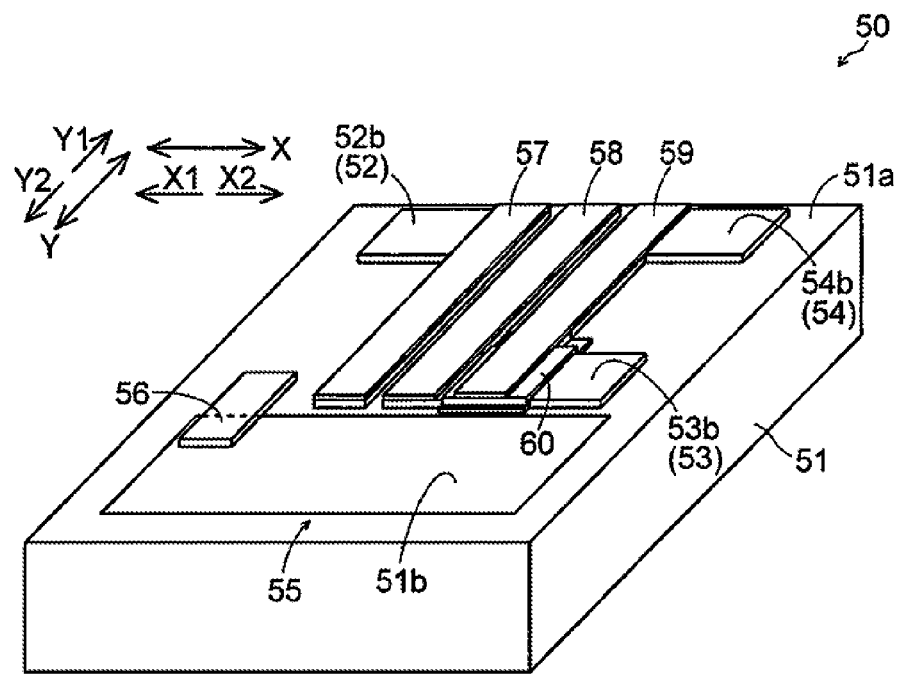
FIG. 3 is a perspective view of a structure of the sub-mount according to one embodiment of the present invention depicted in FIG. 1.

In this embodiment, as depicted in FIG. 3, the sub-mount 50 includes a semiconductor substrate 51 made of n-type silicon, electrodes 52, 53, and 54 formed on a top surface 51a of the semiconductor substrate 51. The n-type is an example of a "first conductivity type" of the present invention and the top surface 51a is an example of a "surface" of the present invention.

Figure 4:
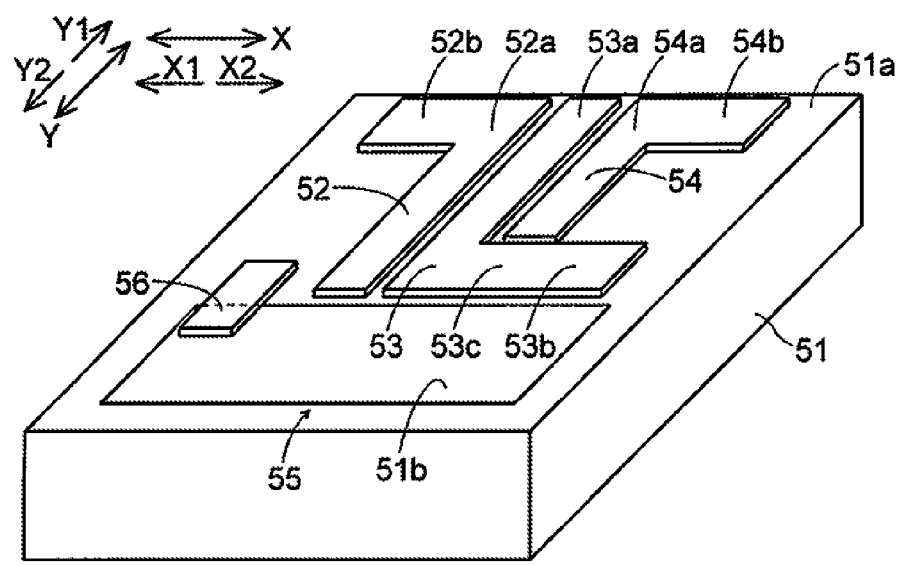
FIG. 4 is a perspective view of the structure except a solder layer and an insulating layer of the sub-mount depicted in FIG. 1 of one embodiment of the present invention depicted in FIG. 1.

A p-type area 51b is formed in a predetermined area on the Y2-direction side of the top surface 51a of the semiconductor substrate 51 by doping with a p-type impurity. This p-type area 51b and the n-type area under the p-type area 51b of the semiconductor substrate 51 make up a photodiode 55 for monitoring the optical outputs of the blue-violet semiconductor laser element 10 and the two-wavelength semiconductor laser element 20. As depicted in FIG. 4, the p-type area 51b (photodiode 55) is formed on the Y2-direction side of an element mounting portion 52a described later of the electrode 52, an element mounting portion 53a described later of the electrode 53, and an element mounting portion 54a described later of the electrode 54. The p-type is an example of a "second conductivity type" of the present invention and the p-type area 51b is an example of a "second conductivity type area" of the present invention. The photodiode 55 is an example of a "light receiving element" of the present invention.

An electrode 56 is formed on a predetermined area of the p-type area 51b to output a monitor current generated by the photodiode 55 to the outside. This electrode 56 is formed by depositing (vapor-depositing) Al, etc. The electrode 56 is bonded with an Au wire not shown.

The electrodes 52, 53, and 54 are formed by depositing Al, etc., and are formed with a thickness of about 1 μm, for example.

The element mounting portion 52a described later of the electrode 52, the element mounting portion 53a described later of the electrode 53, and the element mounting portion 54a described later of the electrode 54 are arranged in the X-direction in this order.

The electrode 52 includes the element mounting portion 52a mounted with the semiconductor laser element portion 10a (see FIG. 1) of the blue-violet semiconductor laser element 10 and a wiring portion 52b connected to the element mounting portion 52a. The element mounting portion 52a is an example of "element mounting portions disposed at both ends" of the present invention.

The wiring portion 52b projects from the element mounting portion 52a only in the X1-direction without projecting in the Y-direction. The length of the element mounting portion 52a in the Y-direction is the same as the length of the electrode 52 in the Y-direction. The length of the element mounting portion 52a in the Y-direction is substantially the same as the length of the semiconductor laser element portion 10a (see FIG. 1) of the blue-violet semiconductor laser element 10 in the Y-direction.

As depicted in FIG. 3, on the element mounting portion 52*a* (see FIG. 4), a solder layer 57 is provided for electrically connecting the semiconductor laser element portion 10*a* (see FIG. 1) of the blue-violet semiconductor laser element 10 to the electrode 52. The solder layer 57 is formed by depositing AuSn, etc., and is formed with a thickness of about 0.2 μm, for example. The solder layer 57 is an example of a "conductive adhesive layer" of the present invention.

The wiring portion 52*b* is bonded with an Au wire not shown.

As depicted in FIG. 4, the electrode 53 includes the element mounting portion 53*a* mounted with the red semiconductor laser element portion 30 (see FIG. 1) of the two-wavelength semiconductor laser element 20 and a wiring portion 53*b* connected to the element mounting portion 53*a*. The element mounting portion 53*a* is an example of an "element mounting portions disposed at an inner position" of the present invention.

The wiring portion 53*b* projects from the element mounting portion 53*a* only in the X2-direction without projecting in the Y-direction. The length of the element mounting portion 53*a* in the Y-direction is the same as the length of the electrode 53 in the Y-direction. The length of the element mounting portion 53*a* in the Y-direction is substantially the same as the length of the red semiconductor laser element portion 30 (see FIG. 1) in the Y-direction.

As depicted in FIG. 3, on the element mounting portion 53*a* (see FIG. 4), a solder layer 58 is provided for electrically connecting the red semiconductor laser element portion 30 (see FIG. 1) to the electrode 53. The solder layer 58 is formed by depositing AuSn, etc., and is formed with a thickness of about 0.2 μm, for example. The solder layer 58 is an example of the "conductive adhesive layer" of the present invention.

In this embodiment, as depicted in FIG. 4, the wiring portion 53*b* is formed to extend outward further than the element mounting portion 54*a* described later of the electrode 54 in the X2-direction.

The wiring portion 53*b* is formed to pass between the element mounting portion 54*a* described later of the electrode 54 and the photodiode 55. As depicted in FIG. 1, the wiring portion 53*b* is formed to pass under the infrared semiconductor laser element portion 40 of the two-wavelength semiconductor laser element 20.

Figure 5:
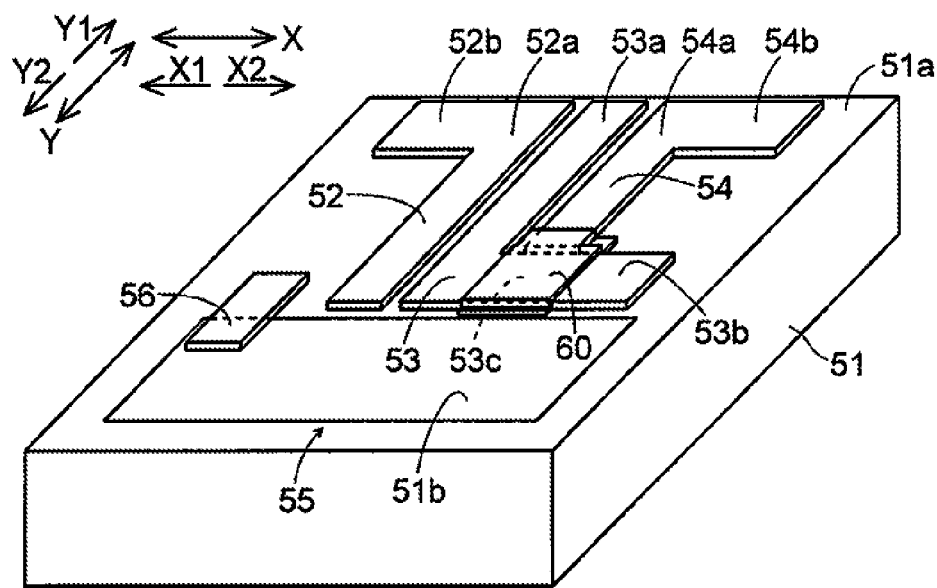
FIG. 5 is a perspective view of the structure except the solder layer of the sub-mount according to one embodiment of the present invention depicted in FIG. 1.

In this embodiment, as depicted in FIG. 5, the wiring portion 53*b* includes an element mounting area 53*c* mounted with a portion of the infrared semiconductor laser element portion 40 (see FIG. 1) and an insulating layer 60 is disposed on the element mounting area 53*c*. The insulating layer 60 is formed by depositing SiO$_2$, etc., and is formed with a thickness of about 0.1 μm to about 0.2 μm, for example. The element mounting area 53*c* is formed on a portion of the wiring portion 53*b* in the Y2 direction from the element mounting portion 54*a* described later of the electrode 54.

As depicted in FIG. 3, a portion of a solder layer 59 described later is disposed on the insulating layer 60. As depicted in FIG. 5, the insulating layer 60 has an area greater than the element mounting area 53*c* of the wiring portion 53*b*. This facilitates preventing the electrode 53 and the solder layer 59 (see FIG. 3) from being electrically connected.

Although a portion of the insulating layer 60 is disposed on the Y2-direction side end of the element mounting portion Ma described later in this embodiment, the insulating layer 60 does not have to be disposed on the Y2-direction side end of the element mounting portion 54*a*.

Figure 6:
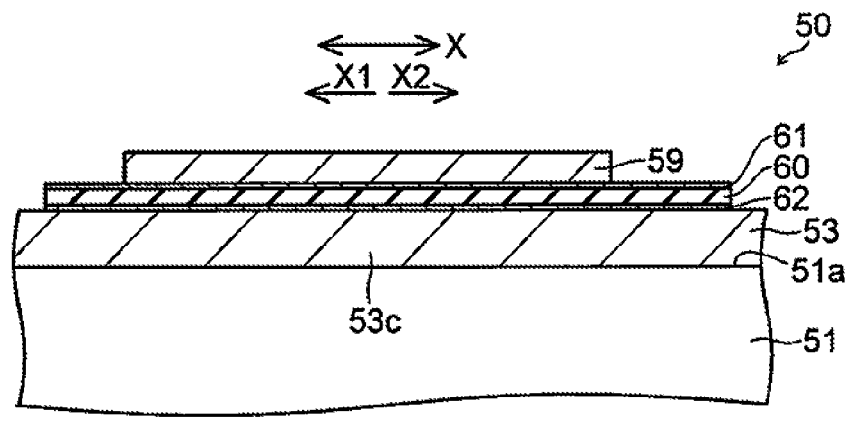
FIG. 6 is an enlarged cross-section view of the structure around the insulating layer of the sub-mount according to one embodiment of the present invention depicted in FIG. 1.

As depicted in FIG. 6, an adhesive layer 61 is formed on the top surface of the insulating layer 60 (between the insulating layer 60 and the solder layer 59 described later). An adhesive layer 62 is formed on the under surface of the insulating layer 60 (between the insulating layer 60 and the element mounting area 53*c* (the electrode 53)). Each of the adhesive layers 61 and 62 is made up of a chrome layer having a thickness of about 0.01 μm or less. The adhesive layer 61 is an example of a "second adhesive layer" of the present invention. The adhesive layer 62 is an example of a "first adhesive layer" of the present invention.

The adhesive layer 61 is provided to enhance adhesive strength between the insulating layer 60 and the solder layer 59 described later and the adhesive layer 62 is provided to enhance adhesive strength between electrode 53 and the insulating layer 60.

An Au wire not shown is bonded to a portion of the wiring portion 53*b* (see FIG. 5) on the X2-direction side of the insulating layer 60.

As depicted in FIG. 4, the electrode 54 includes the element mounting portion 54*a* mounted with a portion of the infrared semiconductor laser element portion 40 (see FIG. 1) of the two-wavelength semiconductor laser element 20 and a wiring portion 54*b* connected to the element mounting portion 54*a*. The element mounting portion 54*a* is an example of the "element mounting portions disposed at both ends" of the present invention.

The wiring portion 54*b* projects from the element mounting portion 54*a* only in the X2-direction without projecting in the Y-direction. The length of the element mounting portion 54*a* in the Y-direction is the same as the length of the electrode 54 in the Y-direction.

The length of the element mounting portion 54*a* in the Y-direction is less than the length of the infrared semiconductor laser element portion 40 (see FIG. 1) in the Y-direction. The length of the element mounting portion 54*a* in the Y-direction is less than the lengths of the element mounting portions 52*a* and 53*a* in the Y-direction.

As depicted in FIG. 3, on the element mounting portion 54*a* (see FIG. 4), the solder layer 59 is provided for electrically connecting the infrared semiconductor laser element portion 40 (see FIG. 1) to the electrode 54. The solder layer 59 is formed by depositing AuSn, etc., and is formed with a thickness of about 0.2 μm, for example. The solder layer 59 is an example of the "conductive adhesive layer" of the present invention.

As depicted in FIGS. 1 and 2, when the infrared semiconductor laser element portion 40 is mounted on the solder layer 59, the solder layer 59 and the electrode layer 42 of the infrared semiconductor laser element portion 40 can absorb the step (thickness) of the insulating layer 60 and the infrared semiconductor laser element portion 40 (two-wavelength semiconductor laser element 20) is disposed parallel to the top surface 51*a* of the semiconductor substrate 51 of the sub-mount 50.

The wiring portion 54*b* (see FIG. 1) is bonded with an Au wire not shown.

In this embodiment, the photodiode 55 is disposed on the sub-mount 50 as described above to thereby simplify the structure of the three-wavelength semiconductor laser apparatus 1 and constrain the apparatus from increasing in size as compared to the case of providing a photodiode (light receiving element) separately from the sub-mount 50.

In this embodiment, as described above, the length of the element mounting portion 54*a* in the Y-direction is made less than the length of the element mounting portion 53*a* in the Y-direction and the electrode 53 is provided with the wiring portion 53*b* extending outward further in the X2-direction than the element mounting portion 54*a*. Since this eliminates the need for disposing the wiring portion 53*b* between the element mounting portion 53a and the element mounting portion 52a or between the element mounting portion 53a and the element mounting portion 54a, this enables the element mounting portion 52a, the element mounting portion 53a, and the element mounting portion 54a to be arranged closer to each other. Therefore, the semiconductor laser element portion 10a of the blue-violet semiconductor laser element 10 and the red semiconductor laser element portion 30 and the infrared semiconductor laser element portion 40 of the two-wavelength semiconductor laser element 20 are arranged closer to each other. This enables an optical member such as a lens receiving light emitted from the blue-violet semiconductor laser element 10 and the two-wavelength semiconductor laser element 20 to be shared by the blue-violet semiconductor laser element 10 and the two-wavelength semiconductor laser element 20. As a result, the number of parts such as optical members can be constrained from increasing and the apparatus can be constrained from increasing in size.

In this embodiment, the length of the element mounting portion 54a in the Y-direction is made less than the length of the element mounting portion 53a in the Y-direction as described above, to thereby ensure that the wiring portion 53b of the electrode 53 is formed outward in the X2-direction further than the element mounting portion 54a without projecting from the element mounting portion 53a in the Y-direction and without contacting with the electrode 54. Since the wiring portion 53b is formed without projecting from the element mounting portion 53a in the Y-direction as described above, the distance can be constrained from increasing between the blue-violet semiconductor laser element 10 and the photodiode 55, and between the two-wavelength semiconductor laser element 20 and the photodiode 55.

In this embodiment, the insulating layer 60 is disposed on the element mounting area 53c as described above to thereby constrain the electrode 53 from electrically connecting with the infrared semiconductor laser element portion 40 and to dispose the wiring portion 53b passing under the infrared semiconductor laser element portion 40.

In this embodiment, since the solder layers 57, 58, and 59 are disposed in advance on the element mounting portions 52a, 53a, and 54a of the sub-mount 50 as described above to eliminate the need for disposing the solder layers 57, 58, and 59 on the element mounting portions 52a, 53a, and 54a when the blue-violet semiconductor laser element 10 and the two-wavelength semiconductor laser element 20 are mounted on the sub-mount 50, the manufacturing process can be simplified when the blue-violet semiconductor laser element 10 and the two-wavelength semiconductor laser element 20 are mounted on the sub-mount 50.

In this embodiment, the length of the element mounting portion 54a in the Y-direction is made less than the length of the element mounting portion 53a in the Y-direction and the wiring portion 53b is formed to extend in the X2-direction as described above to eliminate the need for reducing the length of the element mounting portion 52a in the Y-direction, thus constraining the adhesive strength from deteriorating between the sub-mount 50 (element mounting portion 52a) and the blue-violet semiconductor laser element 10. Although the length of the element mounting portion 54a in the Y-direction is less than the lengths of the element mounting portion 52a and the element mounting portion 53a in the Y-direction, the two-wavelength semiconductor laser element 20 adheres not only to the element mounting portion 54a but also to the element mounting portion 53a, thus ensuring the sufficient adhesive strength between the sub-mount 50 and the two-wavelength semiconductor laser element 20.

In this embodiment, the blue-violet semiconductor laser element 10 and the two-wavelength semiconductor laser element 20 are mounted junction-down on the sub-mount 50 as described above to arrange the light emitting portion 12a (the semiconductor laser element portion 10a) of the blue-violet semiconductor laser element 10 and the light emitting portion 31a (the red semiconductor laser element portion 30) and the light emitting portion 41a (the infrared semiconductor laser element portion 40) of the two-wavelength semiconductor laser element 20 closer to the top surface 51a of the semiconductor substrate 51 of the sub-mount 50. Therefore, even when the photodiode 55 is disposed closer to the blue-violet semiconductor laser element 10 and the two-wavelength semiconductor laser element 20, the lights emitted from the light emitting portion 12a of the blue-violet semiconductor laser element 10 and the light emitting portions 31a and 41a of the two-wavelength semiconductor laser element 20 can easily be made incident on the photodiode 55.

The embodiment disclosed herein should be considered to be illustrative in every respect and not limitative. The range of the present invention is indicated by claims rather than the description of the embodiment and includes meaning equivalent to claims and all the modifications within the range.

For example, although the first conductivity type and the second conductivity type are n-type and p-type, respectively, in the example described in the embodiment, this is not a limitation to the present invention and the first conductivity type and the second conductivity type may be p-type and n-type, respectively.

Although a two-wavelength semiconductor laser element including two semiconductor laser element portions is used for the second semiconductor laser element (multi-wavelength semiconductor laser element) in the example described in the embodiment, this is not a limitation to the present invention and a multi-wavelength semiconductor laser element including three or more semiconductor laser element portions may be used.

A multi-wavelength semiconductor laser element may be used for the first semiconductor laser element.

Although the sub-mount is provided with three electrodes each including an element mounting portion in the example described in the embodiment, this is not a limitation to the present invention and the sub-mount may be provided with four or more electrodes each including an element mounting portion. For example, if the sub-mount is provided with four electrodes each including an element mounting portion, the wiring portions of the two electrodes at inner positions may be formed to extend outward in X-directions further than the electrodes at both ends.

Although the blue-violet semiconductor laser element emitting a blue-violet laser beam is used for the first semiconductor laser element in the example described in the embodiment, this is not a limitation to the present invention and a semiconductor laser element emitting a laser beam other than the blue-violet laser beam may be used.

Although the second semiconductor laser element (multi-wavelength laser element) includes the red semiconductor laser element portion that emits a red laser beam and the infrared semiconductor laser element portion that emits an infrared laser beam in the example described in the embodiment, this is not a limitation to the present invention and the second semiconductor laser element may include semiconductor laser element portions emitting laser beams other than red and infrared laser beams.

Although the blue-violet semiconductor laser element and the two-wavelength semiconductor laser element are mounted on the sub-mount in the example described in the embodiment, this is not a limitation to the present invention and the blue-violet semiconductor laser element and the two-wavelength semiconductor laser element may be mounted on a mounting member other than the sub-mount.

Figure 7:
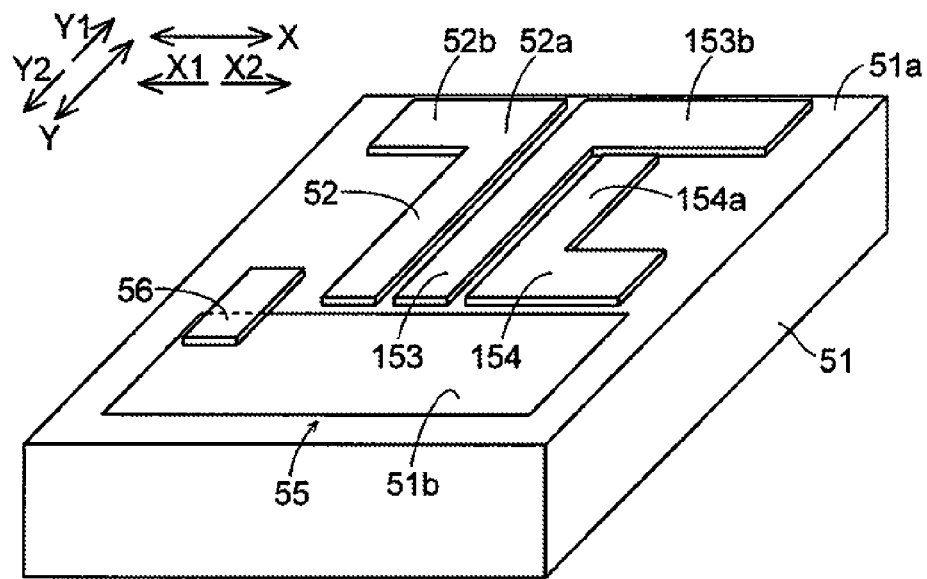
FIG. 7 is a perspective view for explaining a structure of a sub-mount according to a first variation of the present invention.

Although the wiring portion 53b of the electrode 53 is formed to pass between the element mounting portion 54a of the electrode 54 and the photodiode 55 in the example described in the embodiment, this is not a limitation to the present invention and, as in a first variation of the present invention depicted in FIG. 7, a wiring portion 153b of an electrode 153 may be formed not to pass between an element mounting portion 154a of an electrode 154 and the photodiode 55.

Figure 8:
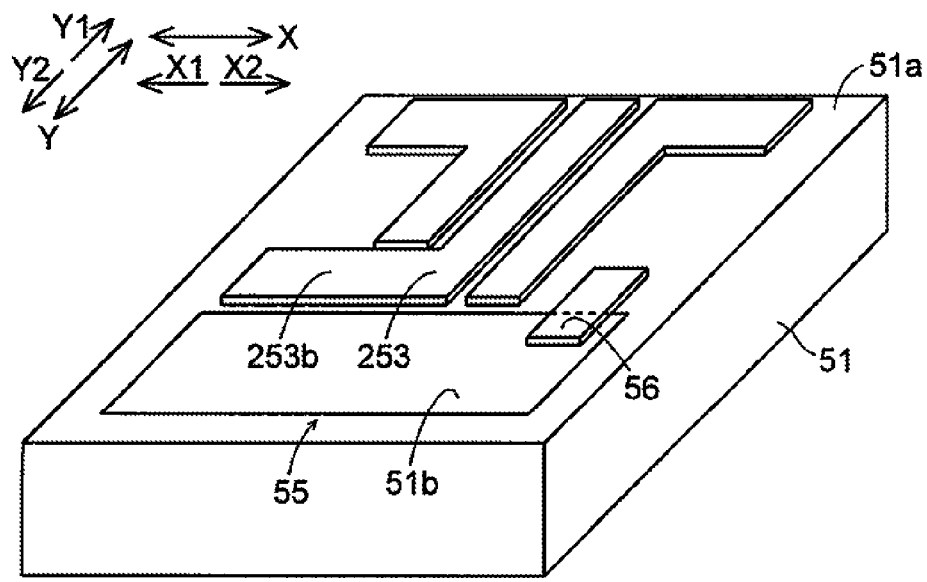
FIG. 8 is a perspective view for explaining a structure of a sub-mount according to a second variation of the present invention.

Although the wiring portion 53b of the electrode 53 is formed to pass under the infrared semiconductor laser element portion in the example described in the embodiment, this is not a limitation to the present invention and, as in a second variation of the present invention depicted in FIG. 8, a wiring portion 253b of an electrode 253 may be formed to pass under the blue-violet semiconductor laser element.

Although the wiring portion 53b of the electrode 53 is formed to extend on one side of the X-direction (in the X2-direction) in the example described in the embodiment, this is not a limitation to the present invention and the wiring portion 53b may be formed to extend on both sides of the X-direction (in the X1-direction and the X2-direction).

Although the sub-mount having the solder layers disposed on the electrodes is used in the example described in the embodiment, this is not a limitation to the present invention and the solder layers may not be disposed on the electrodes of the sub-mount in advance.

Although the electrodes and the solder layers of the sub-mount are formed by deposition in the example described in the embodiment, this is not a limitation to the present invention and the electrodes and the solder layers of the sub-mount may be formed by using a plating method, for example.

What is claimed is:

1. A mounting member mounted with a first semiconductor laser element and a second semiconductor laser element, the second semiconductor laser element being a monolithic multi-wavelength semiconductor laser element, comprising: three or more electrodes respectively having element mounting portions arranged in a first direction; and a light receiving element disposed in a second direction, which intersects with the first direction, with respect to the element mounting portions, wherein a length in the second direction of at least one of the element mounting portions disposed at both ends in the first direction among the three or more element mounting portions is smaller than a length in the second direction of an element mounting portion disposed at an inner position in the first direction among the three or more element mounting portions, the electrode having the element mounting portion disposed at the inner position includes a wiring portion which is connected to the element mounting portion disposed at the inner position and which extends outward in the first direction further than the at least one of the element mounting portions disposed at both ends, wherein
the length in the second direction of one of the element mounting portions disposed at both ends is smaller than the length in the second direction of the element mounting portion disposed at the inner position, and
the wiring portion is formed to extend outward in the first direction further than the one of the element mounting portions disposed at both ends and pass between the one of the element mounting portions disposed at both ends and the light receiving element, wherein
a light receiving element electrode is formed on a predetermined area of the light receiving element to output a monitor current to an outside,
the light receiving element electrode and the wiring portion are disposed on opposite sides of the element mounting portion disposed at the inner position in the first direction,
the light receiving element is formed so as to extend outward in the first direction further than the element mounting portions disposed at both ends, and
the light receiving element electrode is formed so as to extend in the second direction to beside the element mounting portions in the first direction.

2. The mounting member of claim 1, wherein the wiring portion has an element mounting area on a portion thereof in the second direction with respect to the at least one of the element mounting portions disposed at both ends, and an insulating layer is disposed on the element mounting area.

3. The mounting member of claim 2, wherein a first adhesive layer is disposed between the element mounting area and the insulating layer.

4. The mounting member of claim 1, wherein a conductive adhesive layer is disposed on the element mounting portion.

5. The mounting member of claim 4, wherein the wiring portion has an element mounting area on a portion thereof in the second direction with respect to the at least one of the element mounting portions disposed at both ends, an insulating layer is disposed on the element mounting area, a portion of the conductive adhesive layer is disposed on the insulating layer, and a second adhesive layer is disposed between the insulating layer and the conductive adhesive layer.

6. The mounting member of claim 1, wherein a length in the second direction of the electrode having the element mounting portion disposed at the inner position is substantially the same as the length in the second direction of the element mounting portion disposed at the inner position.

7. The mounting member of claim 1, further comprising a first conductivity type semiconductor substrate having the three or more electrodes formed on a surface thereof, wherein the light receiving element is formed by disposing a second conductivity type area in a portion of the semiconductor substrate in the second direction with respect to the element mounting portion.

8. The mounting member of claim 1, wherein the first semiconductor laser element and the second semiconductor laser element are mounted junction-down.

9. A semiconductor laser apparatus comprising: a mounting member, a first semiconductor laser element mounted on the mounting member; and a second semiconductor laser element mounted on the mounting member, the second semiconductor laser element being a monolithic multi- wavelength semiconductor laser element, wherein the mounting member includes three or more electrodes respectively having element mounting portions arranged in a first direction, and a light receiving element disposed in a second direction, which intersects with the first direction, with respect to the element mounting portions, a length in the second direction of at least one of the element mounting portions disposed at both ends in the first direction among the three or more element mounting portions is smaller than a length in the second direction of an element mounting portion disposed at an inner position in the first direction among the three or more element mounting portions, and the electrode having the element mounting portion disposed at the inner position includes a wiring portion which is connected to the element mounting portion disposed at the inner position and which extends outward in the first direction further than the at least one of the element mounting portions disposed at both ends,
wherein
the length in the second direction of one of the element mounting portions disposed at both ends is smaller than the length in the second direction of the element mounting portion disposed at the inner position, and
the wiring portion is formed to extend outward in the first direction further than the one of the element mounting portions disposed at both ends and pass between the one of the element mounting portions disposed at both ends and the light receiving element,
wherein
a light receiving element electrode is formed on a predetermined area of the light receiving element to output a monitor current to an outside,
the light receiving element electrode and the wiring portion are disposed on opposite sides of the element mounting portion disposed at the inner position in the first direction,
the light receiving element is formed so as to extend outward in the first direction further than the element mounting portions disposed at both ends, and
the light receiving element electrode is formed so as to extend in the second direction to beside the element mounting portions in the first direction.

10. The mounting member of claim 1, wherein
the electrode that includes one of the element mounting portions disposed at both ends includes one wiring portion, and
the one wiring portion is disposed outward, in the first direction, of the one of the element mounting portions disposed at both ends.

11. The mounting member of claim 1, wherein
the electrode that includes the other of the element mounting portions disposed at both ends includes another wiring portion, and
the another wiring portion is disposed outward, in the first direction, of the other of the element mounting portions disposed at both ends.

12. The mounting member of claim 1, wherein
laser element portions of the second semiconductor laser element are respectively mounted on the element mounting portion disposed at the inner position and on the other of the element mounting portions disposed at both ends.

13. The mounting member of claim 1, wherein
the light receiving element electrode which is formed on a predetermined area of the light receiving element is formed to extend toward the outside of the light receiving element.

14. The mounting member of claim 13, wherein
the light receiving element electrode which is formed on a predetermined area of the light receiving element is formed to extend toward the front end portion of the optical waveguide of the first semiconductor laser element and the second semiconductor laser element in the second direction.

* * * * *